United States Patent [19]

Shaul et al.

[11] 4,001,466
[45] Jan. 4, 1977

[54] PROCESS FOR PREPARING PRINTED CIRCUITS

[75] Inventors: Anthony James Shaul, Wokingham; Edward Russell Wood, Twyford, both of England

[73] Assignee: Formica International Limited, London, England

[22] Filed: Oct. 23, 1975

[21] Appl. No.: 625,007

Related U.S. Application Data

[62] Division of Ser. No. 419,475, Nov. 27, 1973, Pat. No. 3,925,138.

[52] U.S. Cl. .................... 427/96; 156/3; 156/7; 156/22; 156/150; 156/237; 156/246; 156/249; 156/280; 156/289; 156/330; 427/98; 427/307; 427/322

[51] Int. Cl.² ............... H05K 3/00; C09J 7/00; C23C 3/02

[58] Field of Search ............ 156/2, 3, 7, 8, 11, 156/18, 22, 231, 237, 238, 278, 280, 246, 249, 264, 330, 335, 289, 323, 150, 222, 228, 344; 427/96, 97, 98, 304, 306, 307, 322; 96/36.2; 174/68.5; 29/625; 264/135, 257, 258; 428/196, 209, 901

[56] References Cited
UNITED STATES PATENTS

| | | | |
|---|---|---|---|
| 2,680,699 | 6/1954 | Rubin | 156/278 X |
| 2,684,350 | 7/1954 | Williams | 260/845 |
| 3,131,103 | 4/1964 | Bogue et al. | 156/3 |
| 3,215,574 | 11/1965 | Korb | 156/323 |
| 3,347,724 | 10/1967 | Schneble et al. | 156/151 |
| 3,526,573 | 9/1970 | Kepple et al. | 156/3 X |
| 3,625,758 | 12/1971 | Stahl et al. | 427/98 X |
| 3,686,359 | 8/1972 | Solidatos et al. | 260/836 |
| 3,758,304 | 9/1973 | Janssen et al. | 156/2 X |

*Primary Examiner*—William A. Powell
*Assistant Examiner*—Thomas Bokan
*Attorney, Agent, or Firm*—Cushman, Darby & Cushman

[57] ABSTRACT

The invention relates to printed circuits and to insulating substrates useful in their preparation.

The invention provides a process for preparing an insulating substrate by curing a layer of an etchable synthetic rubber and a thermosettable resin to give a selectively etchable layer, superimposing the layer on a fibrous sheet or web impregnated with a thermosettable resin and consolidating the assembly as produced by heating under pressure.

Printed circuits prepared from the insulating substrates have superior peel strength.

5 Claims, No Drawings

PROCESS FOR PREPARING PRINTED CIRCUITS

This is a division of application Ser. No. 419,475 filed Nov. 27, 1973, now U.S. Pat. No. 3,925,138.

This invention relates to a process for preparing insulating substrates.

Printed circuits consist essentially of an electrically insulating substrate associated with one or more electrically conducting circuit patterns. Commonly the insulating substrate comprises a synthetic resin composition reinforced with non-conducting fibrous materials, for example fibrous glass sheets or papers or webs or mats of glass fibres in either woven or unwoven form, or paper sheets; the electrically conducting circuit pattern is substantially of copper.

The substrates prepared by the process of this invention may be used to prepare printed circuits by any of the processes known for the formation of a firmly adherent conductive metal layer or pattern on resin-impregnated fibrous materials wherein the metal foil or pattern is formed on the substrate by an electroless deposition process.

The use of insulating substrates to prepare printed circuits by electroless deposition techniques is well known. For example, in the preparation of such printed circuits, it is known to employ an insulating substrate prepared by coating a preformed insulating core with an insulating resinous layer adhered to the core and heat cured thereon, said layer having uniformly distributed therein particles of a resin or rubber oxidisable and/or degradable by suitable oxidising chemicals.

This latter process provides a material for the production of printed circuits having improved peel-strengths over those prepared by hitherto known processes but suffers from the drawback that it is difficult to prepare consistently, from this material, printed circuits wherein the conductive pattern, comprises fine line conductors with close spacing. In order that fine line conductors having close spacing may be satisfactorily and consistently prepared it is necessary for the substrate surface to be substantially planar; the difficulties that are associated with the above known technique are believed to arise because no provision is made therein to ensure that the surface of the insulating layer is, and remains, substantially planar during the curing operation; further no provision is made to ensure that the substrate is, and remains, planar during the curing of the insulating layer.

The present invention provides a process for preparing an insulating substrate with a substantially planar surface and which is adapted to receive a layer or pattern of conductive metal by electroless deposition techniques.

The process of the invention is one for preparing an insulating substrate suitable for use in printed circuits, the process comprising 1. substantially curing a mixture comprising a selectively or uniformly etchable synthetic rubber polymer (as defined herein) and a first thermosettable resin to give a selectively etchable layer comprising the rubber and the thermoset resin, 2. superimposing the layer on a fibrous sheet or web impregnated with a second thermosettable resin or on a stack of said impregnated fibrous sheets or webs, and 3. consolidating, preferably between planar press plates, the assembly so produced and curing said second thermosettable resin by heating under pressure.

The thermosettable resin employed in step (1) may be the same as or different from that employed in step (2) provided that the resins are such that adequate bonding between the layers formed by the steps is achieved during the consolidaton of step (3).

If desired the mixture can also comprise a volatile medium which can be a solvent; the volatile medium is suitably removed during the curing of step (1).

Any thermosettable resin known for use in preparing printed circuit substrates may be employed in steps (1) and (2) provided it or they produce, together with the other materials employed, the desired properties in the finished substrate. Examples are phenol-formaldehyde, urea-formaldehyde, melamine-formaldehyde, modified methacrylic, polyester and epoxy resins; normally phenol-formaldehyde resins are employed when the most stringent properties are not required, whilst epoxy resins are preferred when they are required. For impregnating the fibrous sheets or webs utilised in step (2) the resin may be employed in any convenient form and manner, but it is preferred to use a varnish wherein the resin is dispersed or dissolved in a suitable medium. The weight of resin solids in the varnish is not generally critical but it is preferred to employ varnishes comprising 35% to 70%, e.g. 35% to 55%, resin solids by weight.

The thermosettable resin and synthetic rubber polymer employed in preparing the mixture must be compatible, that is no unwanted or deleterious physical or chemical interactions between them must occur. The proportion of thermosettable resin to synthetic rubber in the mixture may vary widely, but preferably the mixture comprises 10% to 99% by weight of synthetic rubber polymer solids based on the solvent-free weight of the mixture.

The terms "etchable synthetic rubber polymer" refers to those synthetic rubber compositions which in the substantially cured state are attacked by chemical etchant solutions. Such compositions are known, and include those compositions that are uniformly etchable as well as those known to be selectively etchable (these latter, when exposed to chemical etchants, are attacked in a non-uniform manner whereby pits and pores of microscopic size are formed in the surface).

Suitable selectively etchable rubber polymers are the acrylonitrile-butadiene-styrene terpolymers, acrylonitrile-butadiene copolymers (nitrile rubbers) and butadiene-styrene copolymers while suitable uniformly etchable rubber polymers are the butadiene rubber polymers and the neoprene rubber polymers.

Suitable chemical etchants are also generally known; examples are chromium trioxide in water, sulphuric-chromic and sulphuric-phosphoric acid mixtures and potassium dichromate in sulphuric acid, The process can be suitably performed by any of the following embodiments:

I. Transfer embodiment — A transfer sheet or web of material that does not form strong adhesive bonds with the mixture comprising a thermosettable resin and an etchable synthetic rubber polymer either in the cured or uncured state is employed; suitable materials are siliconised parchments, release-coated aluminum foils and treated or untreated polymeric films. A layer of the mixture is applied to the surface of the transfer material by any convenient method, for example by roller coating, and then the coated transfer material is heated to remove substantially all of any solvent present and to convert the mixture to the substantially fully cured state.

II. Impregnation embodiment — A fibrous sheet or web is impregnated in any suitable manner with the mixture. The impregnated fibrous material is then heated whereby the solvent if present in the impregnating mixture is removed and the mixture is substantially fully cured.

III Unsupported film embodiment — If the mixture can be formed into an unsupported film, this film (prepared by any technique suitable for forming such a film, for example by casting or by extrusion) may be employed in the process provided that before assembling the film as part of the substrate assembly it is subjected to the treatment necessary to convert it to the substantially fully cured state.

IV. Coating embodiment — A fibrous sheet or web is impregnated with a thermosettable resin varnish composition and then coated on one surface in any suitable manner with the mixture. Optionally the impregnated sheet may be dried before coating. The impregnated and coated sheet is then heated to remove substantially all of any solvent present and to substantially fully cure the mixture.

V. Soluble carrier embodiment — A layer of the mixture is formed on a layer of a material with which the mixture forms adhesive bonds. The coated carrier is then heated so that substantially all of any solvent present is removed and the mixture is substantially fully cured. The coated carrier is cut into sheets and then assembled on one or both sides of a stack of impregnated fibrous webs or sheets, with the coated surface in contact with the stack, and the assembly is then consolidated between planar press plates using heat and pressure.

After removal from the press, the laminate thus formed is treated with a suitable reagent whereby the carrier material is etched (dissolved) to leave an insulating substrate having one or both major surfaces adapted to receive a layer or pattern of firmly adherent metal deposited by an electroless process.

The layer of material is suitably an aluminium sheet or web; in this case, the material can be etched away with a solution of sodium hydroxide.

With embodiments I, III, IV or V, the layer should be such as to provide a thickness, after pressing, of 0.005 mm. to 0.20 mm., preferably 0.02 mm. to 0.10 mm. When the impregnation embodiment II is employed, the thickness of the layer is suitably at least that of the fibrous reinforcement and it is necessary for the amount of mixture employed in the impregnation to be such as to enable a continuous layer of the mixture to be formed on the consolidated assembly during pressing whilst at the same time not to be such that the continuous layer exceeds 0.1 mm. in thickness. Lower thicknesses make the application of a uniform layer difficult, while greater thicknesses do not show any improvement in properties of the printed circuits produced therefrom and in fact falling off of some properties is observed at thicknesses above 0.1 mm.

Suitable fibrous materials for use in this invention include cellulosic, polymeric or glass fibrous materials which can be utilised in any suitable known form, for example paper sheets woven or unwoven glass cloth, sheets or mats of glass fibres or woven cotton may be used. When preparing substrates for printed circuits that must meet the stringent requirements for high quality electrical and electronic devices (for example, those for computers, data processing equipment, electronic calculators and aerospace equipment), the preferred fibrous material is glass fibre, especially in the form of woven glass fibre sheets. Glass fibre materials give substrates capable of withstanding the processing steps (for example soldering) used in the production of printed circuits, during which the circuit must not warp of otherwise be damaged. Furthermore, where superimposed printed circuits are to be connected together, it is important that the substrates are dimensionally stable; the use of glass fibre papers, mats or woven sheets generally enables the wide variety of stringent electrical and physical requirements to be met. Evenly woven glass fibre sheets have the advantage of enabling substrates with planar surfaces (a property of considerable technical value for printed circuits having fine line patterns) to be produced.

If desired, an insulating substrate comprising a preformed metal sheet may be prepared by the process wherein before the assembly is consolidated, a metal sheet, optionally treated to enhance its bonding to the fibrous sheet, is superimposed on an impregnated fibrous sheet or web or on a stack of said fibrous sheets or webs, the metal sheet being remote from the selectively etchable layer. Alternatively the metal sheet may be inserted within the thickness of the stack. On heating the assembly under pressure a laminate having on one of its surfaces, and/or in the interior thereof, a preformed metal sheet intimately bonded to, and insulated by, the fibrous sheet or sheets is produced.

Step (3) can be carried out in a conventional press using conditions known for preparing conventional thermosettable resin impregnated laminates with substantially planar surfaces. A suitable cure cycle is 10–60 minutes at 120° – 180° C and 35–63 kg/cm$^2$.

The insulating substrates prepared by the process can, after being chemically etched, be readily provided with a thin, firmly-adhered metallic layer or pattern by an electroless deposition process, and are thus most useful in the production of printed circuits, with or without further deposition of metal by an electroless or electrolytic process. Through-hole plated printed circuit boards (including multi-layer boards and assemblies) may also be prepared from the substrates by forming holes in the board prior to the electroless deposition step so that during the deposition of the metal on the board, deposition occurs also on the walls of the holes.

The invention is illustrated by the following Examples.

EXAMPLE 1

A 0.025 mm hard rolled aluminium foil was coated on one surface with a layer comprising a phenyl-methyl silicone resin composition and a hardener therefor and then passed through a heated oven whereby the silicone resin layer was fully cured. To the silicone-coated surface there was then applied, by a roller coating technique, a layer of a mixture comprising a solvent, a thermosettable phenolic resin, a hardener and an acrylonitrile-butadiene rubber. The doubly coated foil was then passed through a horizontal oven to remove substantially all the solvent therefrom and substantially fully to cure the layer comprising the thermosettable resin and rubber.

The double coated foil was then cut into sheets of the desired size and one sheet was assembled upon a stack of three thermosettable epoxy resin impregnated woven glass-cloth sheets (the epoxy resin being in the B state) with the substantially cured resin mixture layer in contact with the epoxy resin impregnated sheets, and the assembly was then pressed using gloss finish stainless steel pressplates and a polymeric release sheet and a press cycle of 35 minutes at 160°–165° C and 49 kg/cm².

After cooling in the press, the consolidated laminate — which was substantially fully cured — was removed therefrom and the release sheet and the silicone coated aluminium foil were stripped off.

The insulating substrate which was useful in the production of a single sided printed circuit, exhibited a substantially planar surface corresponding to that of the press plate employed.

EXAMPLE II

A printed circuit substrate was prepared as described in Example 1 except that the silicone-resin coated aluminium foil was provided with a layer of a mixture comprising a solvent and equal solids weight of a proprietary etchable synthetic rubber composition (Technicoll 801) and a conventional thermosettable epoxy resin in a volatile solvent instead of the layer used in Example 1.

EXAMPLE III.

A web of woven glass cloth (U.S. MIL style 108 ex Clark-Schwebel Fiber Glass Corporation) was impregnated with the mixture used in Example II although the solvent content was altered to facilitate impregnation. The impregnated web was then passed through a vertical oven so as to remove substantially all the solvent therefrom and substantially fully to cure the mixture. The dried impregnated web contained 70% by weight of the mixture solids based on the weight of the dried and cured impregnated web.

The web was then cut into sheets of the desired size which were used to prepare a printed circuit substrate, adapted for the deposition of an adherent metal layer or pattern on both sides thereof, by consolidating — between smooth surfaced press plates — by means of heat and pressure an assembly comprising in order:

i. a polymeric release sheet;
 ii. a sheet of the impregnated woven glass material prepared as above;
 iii. eight sheets of epoxy resin impregnated woven glass sheets with the resin in the B state and with a resin content of about 40% by weight;
 iv. a sheet of the impregnated woven glass material as used in (ii);
 v. a polymeric release sheet.

After cooling in the press, the consolidated laminate was removed and the release sheets stripped therefrom to provide a printed circuit substrate, both sides of which, after treatment with a saturated solution of chromium trioxide in water, were adapted to receive, by electroless deposition, a firmly adherent layer or pattern of metal.

EXAMPLE IV

A web of woven glass cloth (Style 274 from Marglass Co. Ltd.) was impregnated with a known epoxy resin varnish containing a hardener, accelerator and various solvents and was then passed vertically through a drying and curing oven to remove most of the solvent and to convert the resin to the B state. The treated impregnated web was non-tacky and contained 43% by weight resin solids based on the weight of the dried material.

A mixture comprising a thermosettable phenol-formaldehyde resin and polybutadiene in a volatile solvent was then applied to one surface of the impregnated web by a reverse roller coating technique and the coated web then passed through a horizontal oven so that substantially all the solvent was removed from the coating layer and the layer was substantially completely cured.

The web was then cut into sheets of the desired size and an insulating substrate was prepared therefrom utilising the impregnated and coated sheets and polymeric release sheets in place of the impregnated sheets (ii) of Example III.

EXAMPLE V

An insulating substrate, adapted to receive on both of its major surfaces (by electroless deposition) a firmly adherent layer or pattern of a metal, was prepared as described in Example I except that the assembly comprised three thermosetting epoxy resin impregnated woven glass sheets (the epoxy resin being substantially in the B state) sandwiched between two double coated aluminium foil sheets, the coated surfaces of the aluminium foils being in contact with the epoxy impregnated woven glass sheets.

The assembly was then pressed between gloss finish stainless steel press plates as in Example I but in this Example no polymeric release sheet was necessary as its function was performed by the aluminium foil.

After cooling in the press, the consolidated laminate — which was substantially fully cured — was removed therefrom and the silicone coated aluminium foil sheets were stripped off.

The insulating substrate thus prepared had two, substantially planar, major surfaces upon which a double-sided printed circuit having fine lines with close separation and plated-through holes could be satisfactorily produced.

EXAMPLE VI

An unsupported film 0.025 mm thick was prepared by casting on a release surface a solution in an organic solvent of a conventional epoxy resin (1 part) and a proprietary etchable synthetic rubber composition ("Technicoll 801") (3 parts). The cast film was heated in a hot air oven so that the solvent was substantially completely removed and the resin substantially fully cured; the film was then stripped from the release surface.

An insulating substrate, having both major surfaces adapted to receive an adherent metal pattern or layer, was prepared by assembling on either side of a stack of 5 thermosetting phenolformaldehyde resin impregnated paper sheets an unsupported film prepared as above and the assembly pressed between polyvinyl fluoride release sheets using high gloss press plates employing the temperatures and pressures used in Example I.

EXAMPLE VII

An insulating substrate comprising a preformed metal layer was prepared as described in Example I except that an aluminium sheet 1 mm thick having a dull rubbed finish was positioned below the epoxy resin impregnated fibrous sheets. After consolidating, without the use of release sheets, as described in Example I, an insulating substrate, having an aluminium layer useful as a heat sink on one surface thereof, was obtained.

EXAMPLE VIII

A web of hard rolled aluminium foil approximately 0.025 mm thick — not having been previously provided with a silicone release coating — was coated on one surface with a mixture comprising a solvent and equal solids weight of a proprietary etchable rubber composition (Technicoll 801) and a conventional epoxy resin and the coated web passed through a horizontal oven so as to remove substantially all the solvent therefrom and substantially to cure the coating layer. (The coating process was such as to provide, on the insulating substrate assembly after consolidation by heat and pressure, a layer of the cured coating mixture about 0.07 mm thick).

The coated web was cut into sheets and assembled, on either side of a stack of 3 thermosettable epoxy resin impregnated woven glass sheets, with their coated surfaces in contact with the stack.

The assembly was then consolidated as in Example V and when removed from the press comprised a laminate clad on both of its major surfaces with a firmly attached aluminium foil. This foil clad laminate was then treated with a caustic soda solution whereby the aluminium foil layers were dissolved away so forming an insulating substrate adapted to receive, on both of its major surfaces by electroless deposition, a firmly adherent layer or pattern of a metal.

EXAMPLE IX

A 0.025 mm hard rolled aluminium foil was treated with a 1% solution of a wax in xylene to give a wax coating on both surfaces of the foil. The coated foil was passed through a heated oven. To one of the wax coated surfaces there was then applied, by a roller coating technique, a layer of a mixture comprising a solvent, a thermosettable phenolic resin, an epoxy resin, solvents and hardeners for both resins and an acrylonitrilebutadiene rubber. The coated foil was then passed through a horizontal oven to remove substantially all the solvent therefrom and substantially to cure the layer comprising the resins and rubber.

The coated foil was then cut into sheets of the desired size and one sheet was assembled upon a stack of three thermosettable epoxy resin impregnated woven glasscloth sheets (the epoxy resin being in the B state) with the substantially cured resin mixture layer in contact with the epoxy resin impregnated sheets, and the assembly was then pressed using gloss finish stainless steel pressplates and a polymeric release sheet and a press cycle of 35 minutes at 160 to 165°C. and 49 kg/cm².

After cooling in the press, the consolidated laminate which was substantially fully cured - was removed therefrom and the release sheet and the wax coated aluminium foil were stripped off.

The insulating substrate, which was useful in the production of a single sided printed circuit, exhibited a substantially planar surface corresponding to that of the press plate employed.

We claim:
1. A process for preparing a printed circuit comprising an insulating substrate carrying a metal layer or pattern, the process consisting essentially of the steps of:
   1. substantially fully curing a mixture consisting essentially of (a) an etchable synthetic rubber polymer which, in the substantially fully cured state, is attackable by a chemical etchant solution and (b) a first thermosettable resin, to give a selectively etchable and substantially non-adhesive layer consisting essentially of said rubber and the thermoset resin,
   2. superimposing said layer on a fibrous substrate which consists essentially of at least one sheet or web, said sheet or web being impregnated with a second thermosettable resin,
   3. consolidating the assembly so produced and curing said second thermosettable resin by heating under pressure to provide an insulating substrate comprising said selectivity etchable layer on the fibrous substrate,
   4. chemically etching the surface of said selectively etchable layer, and
   5. forming a metal layer or pattern on the etched surface by electroless deposition.

2. A process according to claim 1 wherein said selectively etchable and substantially non-adhesive layer is formed in step (1) on a sheet or web of transfer materials with which said mixture does not form strong adhesive bonds and wherein said transfer material is removed in step (4) before said surface is chemically etched.

3. A process according to claim 2 which comprises:
   1. forming said selectively etchable and substantially non-adhesive layer on an aluminium foil carrying a release coating by curing on said foil a layer of a mixture consisting essentially of (a) said synthetic rubber polymer and (b) a resin mixture consisting essentially of a thermosettable phenolic resin and a first thermosettable epoxy resin,
   2. superimposing said selectively etchable layer while on said foil on a stack of woven glass cloth sheets impregnated with a second thermosettable epoxy resin,
   3. consolidating the assembly so produced and curing said second thermosettable epoxy resin,
   4. removing said foil from said selectively etchable layer and chemically etching the surface of said selectively etchable layer, and
   5. forming a metal layer or pattern on the etched surface by electroless deposition.

4. A process according to claim 1 wherein said selectively etchable and substantially non-adhesive layer is formed in step (1) on a layer of carrier material with which said mixture forms an adhesive bond and wherein said carrier material is dissolved in step (4) before said surface is chemically etched.

5. A process according to claim 4 which comprises
   1. forming said selectively etchable and substantially non-adhesive layer on an aluminium foil not carrying a release coating by curing on said foil a layer of a mixture consisting essentially of (a) said synthetic rubber polymer and (b) a resin mixture consisting essentially of a thermosettable phenolic resin and a first thermosettable epoxy resin,
   2. superimposing said selectively etchable layer while on said foil on a stack of woven glass cloth sheets impregnated with a second thermosettable epoxy resin,
   3. consolidating the assembly so produced and curing said second thermosettable epoxy resin,
   4. dissolving said foil from said selectively etchable layer and chemically etching the surface of said selectively etchable layer, and
   5. forming a metal layer or pattern on the etched surface by electroless deposition.

* * * * *